United States Patent
Kawashima (10) Patent No.: US 9,287,454 B2
(45) Date of Patent: Mar. 15, 2016

(54) NITRIDE SEMICONDUCTOR LIGHT-EMITTING DEVICE WITH A LAYER CONTAINING IN AND MG AND METHOD FOR PRODUCING THE SAME

(71) Applicant: CANON KABUSHIKI KAISHA, Tokyo (JP)

(72) Inventor: Takeshi Kawashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/049,024

(22) Filed: Oct. 8, 2013

(65) Prior Publication Data

US 2014/0097456 A1    Apr. 10, 2014

(30) Foreign Application Priority Data

Oct. 9, 2012  (JP) ................ 2012-224590

(51) Int. Cl.
| | |
|---|---|
| *H01L 27/15* | (2006.01) |
| *H01L 33/32* | (2010.01) |
| *H01L 33/00* | (2010.01) |
| *B82Y 20/00* | (2011.01) |
| *H01S 5/10* | (2006.01) |
| *H01S 5/12* | (2006.01) |
| *H01S 5/183* | (2006.01) |
| *H01S 5/343* | (2006.01) |
| *H01S 5/30* | (2006.01) |

(52) U.S. Cl.
CPC .............. *H01L 33/325* (2013.01); *B82Y 20/00* (2013.01); *H01L 27/156* (2013.01); *H01L 33/0075* (2013.01); *H01L 33/32* (2013.01); *H01S 5/105* (2013.01); *H01S 5/12* (2013.01); *H01S 5/183* (2013.01); *H01S 5/3063* (2013.01); *H01S 5/34333* (2013.01); *H01S 2301/17* (2013.01); *H01S 2301/173* (2013.01); *H01S 2304/04* (2013.01)

(58) Field of Classification Search
CPC . H01L 33/0075; H01L 27/156; H01L 33/325; H01L 33/32; B82Y 20/00
See application file for complete search history.

(56) References Cited

U.S. PATENT DOCUMENTS

| | | | | |
|---|---|---|---|---|
| 6,225,195 | B1 * | 5/2001 | Iyechika | H01L 21/0237 117/104 |
| 6,384,430 | B1 | 5/2002 | Nakatsu | |
| 7,449,404 | B1 * | 11/2008 | Creighton | H01L 21/0254 438/604 |
| 2002/0158259 | A1 * | 10/2002 | Ono | H01S 5/32341 257/79 |
| 2005/0269584 | A1 * | 12/2005 | Hasegawa | B82Y 20/00 257/94 |
| 2008/0029773 | A1 * | 2/2008 | Jorgenson | H01L 33/105 257/94 |
| 2008/0212631 | A1 * | 9/2008 | Takeuchi | B82Y 20/00 372/45.01 |
| 2013/0059407 | A1 * | 3/2013 | Miyazaki | H01L 33/007 438/37 |

FOREIGN PATENT DOCUMENTS

| | | |
|---|---|---|
| CN | 1484324 A | 3/2004 |
| CN | 1606203 A | 4/2005 |
| CN | 101281940 A | 10/2008 |
| JP | 11112030 A | 4/1999 |

(Continued)

*Primary Examiner* — Minh-Loan Tran
*Assistant Examiner* — Farid Khan
(74) *Attorney, Agent, or Firm* — Canon USA Inc. IP Division (57) ABSTRACT

A method for producing a light-emitting device includes the steps of: forming a layer containing In on a substrate in a reactor in which a Mg-containing raw material has been used; and forming an active layer including a nitride semiconductor on the layer containing In.

12 Claims, 7 Drawing Sheets

(56) References Cited

FOREIGN PATENT DOCUMENTS

| | | | |
|---|---|---|---|
| JP | 2008004662 A | 1/2008 | |
| JP | 2010109223 A | 5/2010 | |
| JP | 2011119349 A | 6/2011 | |
| JP | 2012174993 A | 9/2012 | |
| KR | 2013070857 * | 6/2013 | ............ H01L 33/14 |
| WO | 2007012327 A1 | 2/2007 | |

* cited by examiner

NITRIDE SEMICONDUCTOR LIGHT-EMITTING DEVICE WITH A LAYER CONTAINING IN AND MG AND METHOD FOR PRODUCING THE SAME

BACKGROUND OF THE INVENTION

1. Field of the Invention

The present invention relates to a nitride semiconductor light-emitting device and a method for producing the nitride semiconductor light-emitting device.

2. Description of the Related Art

A nitride semiconductor light-emitting device emits light having a wavelength extending from the ultraviolet to the infrared region. When the nitride semiconductor light-emitting device includes an InGaN layer as an active layer, the wavelength in the visible region can be controlled by changing the mixed crystal ratio in the InGaN layer. A blue LED can be combined with a yellow fluorescent material to create a white light source, which has been widely used in display devices and lighting devices. Examples of known acceptor dopants for nitride semiconductors include Be, Mg, and C. Among these elements, Mg is often used as a p-type conductivity dopant because Mg allows a high p-type conductivity to be realized. However, use of Mg causes a problem called "memory effect", which is a phenomenon caused by Mg attached to a reactor member when a Mg-containing raw material was used in the reactor desorbing from the reactor member as it grows and being unintentionally mixed in a crystal. Mixing of Mg in an active layer increases the occurrence of non-radiative recombination, which results in a reduction in luminous efficiency.

Therefore, it is very important to suppress the memory effect and prevent the unintentional doping in the active layer. Mg is discussed above as an example, and other raw materials that can be used for acceptor dopants in GaAs, such as Zn, Se, and Te, have also the problem of memory effect. Hitherto, several methods for addressing the memory effect have been proposed. For example, Japanese Patent No. 3603598 proposes a method for producing a III-V group compound semiconductor light-emitting device. In this method, a semiconductor layer is formed in a reactor in which a Mg-containing raw material is not used and subsequently a p-type semiconductor layer is formed in another reactor in which a Mg-containing raw material is used, and thereby the memory effect is suppressed. Examples of other known methods include a method of cleaning a reactor in which a Mg-containing raw material has been used every time after the growth in order to remove Mg; and a method of growing a thick semiconductor layer that allows Mg to be incorporated thereinto in order to prevent Mg from being mixed in an active layer.

However, these existing methods for manufacturing a nitride semiconductor have the following problems. The method described in Japanese Patent No. 3603598, in which a semiconductor layer is formed in a reactor in which a Mg-containing raw material is not used and subsequently a p-type semiconductor layer is formed in another reactor in which a Mg-containing raw material is used in order to address the memory effect, incurs high cost because two or more reactors need to be prepared. All the other methods described above also incur high cost due to addition of the cleaning step, an increased amount of raw material used, an increased manufacturing time, and the like. These problems occur not only in the case where a nitride semiconductor is used but also in the case where other material systems are used for a semiconductor.

SUMMARY OF THE INVENTION

Accordingly, the present invention provides a nitride semiconductor light-emitting device and a method for producing the nitride semiconductor light-emitting device with which the memory effect may be suppressed at low cost.

A method for producing a light-emitting device including an active layer comprising a nitride semiconductor according to a first aspect of the present invention comprises the steps of:

forming a layer containing In on a substrate in a reactor in which a Mg-containing raw material has been used; and forming an active layer comprising a nitride semiconductor on the layer containing In.

A method for producing a plurality of light-emitting devices, each light-emitting device including an active layer comprising a nitride semiconductor and a Mg-doped p-type semiconductor layer according to a second aspect of the present invention comprises the steps of:

forming a layer containing In on a substrate;

forming an active layer comprising a nitride semiconductor on the layer containing In; and forming a Mg-doped p-type semiconductor layer on the active layer, the steps being repeated in this order.

A light-emitting device according to a third aspect of the present invention comprises:

a layer containing In and Mg on a substrate;

an active layer comprising a nitride semiconductor on the layer containing In and Mg; and a Mg-doped p-type semiconductor layer on the active layer.

Further features of the present invention will become apparent from the following description of exemplary embodiments with reference to the attached drawings.

DESCRIPTION OF THE EMBODIMENTS

Embodiments of the present invention will now be described.

Embodiment 1

Figure 1A:
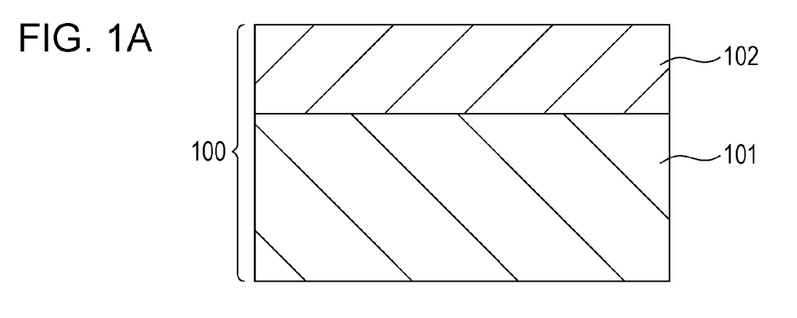
FIGS. 1A to 1C are diagrams for explaining a method for producing a nitride semiconductor light-emitting device according to Embodiment 1 of the present invention.

In Embodiment 1, an example of a method for producing a nitride semiconductor light-emitting device including an InGaN layer is described with reference to FIGS. 1A to 1C.

First, a template substrate 100 is prepared. The template substrate 100 may be prepared by forming a ground layer 102 on a substrate 101 as shown in FIG. 1A. In another case, the substrate 101 may be used alone as the template substrate 100. The template substrate 100 may have any structure as long as it allows a light-emitting device structure including a nitride semiconductor to be formed directly on the template substrate 100 through crystal growth. Specifically, the template substrate 100 may have a structure that allows the active layer 104 and other layers that are to be formed on or above the active layer 104 to be grown. The substrate 101 may be used alone as the template substrate 100 when the substrate 101 is, for example, the following substrate: an n-type GaN substrate, which has conductivity and allows a nitride semiconductor to be grown directly on the substrate; or an n-type SiC substrate, an n-type Si substrate, or an n-type GaAs substrate, which has conductivity and allow a nitride semiconductor to be grown on the substrate with a buffer layer interposed between the nitride semiconductor and the substrate. The ground layer 102 is formed on the substrate 101 when the substrate 101 is a substrate composed of sapphire, SiC, Si, GaAs, ZnO, GaN, AlN, or the like, on which a nitride semiconductor can be grown.

The ground layer 102 is an n-type nitride semiconductor layer. The ground layer 102 may have a conductive single-layer structure such as an n-type GaN single-layer structure or an n-type AlGaN single-layer structure; or a conductive multi-layered structure such as an n-type GaN/n-type AlGaN multi-layered structure. In the case of manufacturing a laser, the ground layer 102 includes a portion of a laser structure that is to be formed below the active layer, which is constituted by, for example, an n-type GaN layer, an n-type AlGaN layer serving as a cladding layer, and a GaN layer serving as a guiding layer. The ground layer 102 may be formed by, for example, metal-organic chemical vapor deposition (MOCVD), hydride vapor phase epitaxy (HVPE), molecular beam epitaxy (MBE), plasma CVD (PCVD), or sputtering.

Then, a light-emitting device structure is grown on the template substrate 100. The light-emitting device structure may be grown using the same manufacturing system as that used in the preparation of the template substrate 100. A method for producing the light-emitting device structure is described below. In the case where an MOCVD system is used, trimethylgallium (TMGa), trimethylaluminum (TMAl), trimethylindium (TMIn), and the like are used as a Group III raw material, and ammonia ($NH_3$) and the like are used as a nitrogen raw material in order to form semiconductor layers. An impurity raw material that imparts conductivity to the semiconductor layers is $SiH_4$ (silane), $Si_2H_6$ (disilane), or the like as an n-type dopant and $Cp_2Mg$ (cyclopentadienyl magnesium) as a p-type dopant.

The template substrate 100 is placed in a reactor of a manufacturing system. Then, as shown in FIG. 1B, a Mg adsorption layer 103, an active layer 104, and a semiconductor layer 105 are grown on the template substrate 100 in the manufacturing system. These layers are formed in one reactor. The active layer 104 is a layer that emits light when a carrier is injected thereinto. An example of such a layer is an InGaN/GaN multiple-quantum-well structure. The semiconductor layer 105 is doped with Mg, that is, a Mg-doped p-type semiconductor layer. The semiconductor layer 105 has a single-layer structure constituted by a p-type GaN layer or a two-layer structure constituted by a p-type AlGaN layer serving as an electron-blocking layer and a p-type GaN layer. The structure of the semiconductor layer 105 is not particularly limited as long as the semiconductor layer 105 is a p-type conductive nitride semiconductor.

Figure 1B:
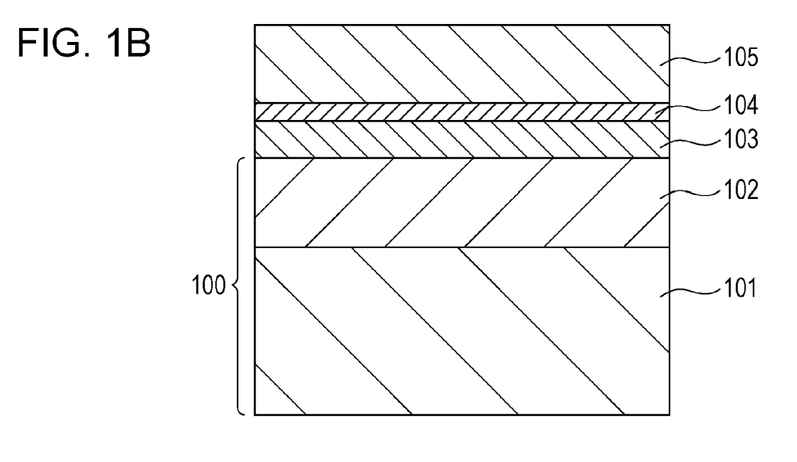
Figure 1C:
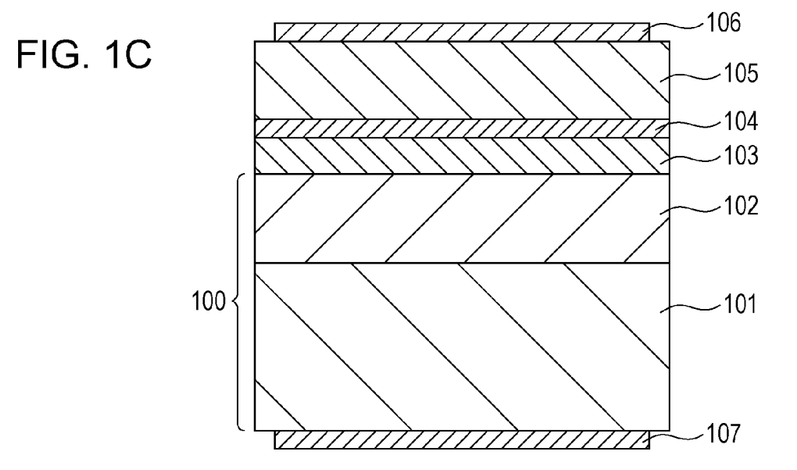

Then, as shown in FIG. 1C, the substrate having a structure including the Mg adsorption layer 103, the active layer 104, and the semiconductor layer 105 is removed from the manufacturing system, and a surface electrode 106 and a backside electrode 107 through which current is injected are formed on the surface and the backside of the substrate by vapor deposition or the like. Thus, a nitride semiconductor light-emitting device is produced. A plurality of the light-emitting diodes can be manufactured by repeating the above-described process shown in FIGS. 1A to 1C. In this case, the step shown in FIG. 1B is performed in one reactor during a process for manufacturing a plurality of light-emitting devices. In other words, after a light-emitting device is manufactured, another substrate is placed in the reactor used in the process for manufacturing the light-emitting device and then the step shown in FIG. 1B is performed again to manufacture another light-emitting device.

If the Mg adsorption layer 103 is absent, Mg adheres to a reactor member when the Mg-doped p-type semiconductor layer 105 is formed as shown in FIG. 1B. Mg adhering to the reactor member then desorbs from the reactor member when the active layer 104 is formed on the template substrate 100 during the following cycle of manufacturing another light-emitting device and is disadvantageously mixed in the active layer 104, which increases the occurrence of non-radiative recombination in the active layer 104 and thus reduces luminous efficiency.

On the other hand, when the Mg adsorption layer 103 is interposed between the template substrate 100 and the active layer 104, the Mg adsorption layer 103 is grown prior to the growth of the active layer 104, and thus Mg that desorbed from a reactor member is efficiently incorporated into the Mg adsorption layer 103. As a result, mixing of Mg in the active layer 104 is suppressed.

Figure 2A:
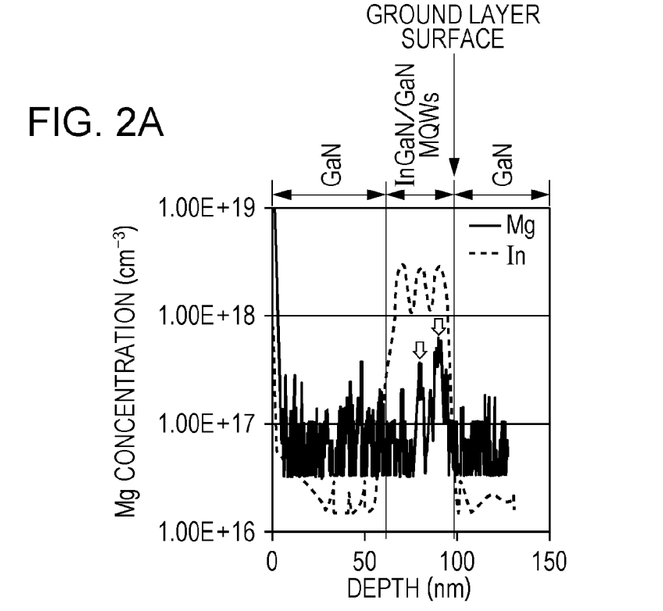
FIGS. 2A and 2B are diagrams showing the results of SIMS analysis to determine the effect of a Mg adsorption layer according to Embodiment 1 of the present invention.
Figure 2B:
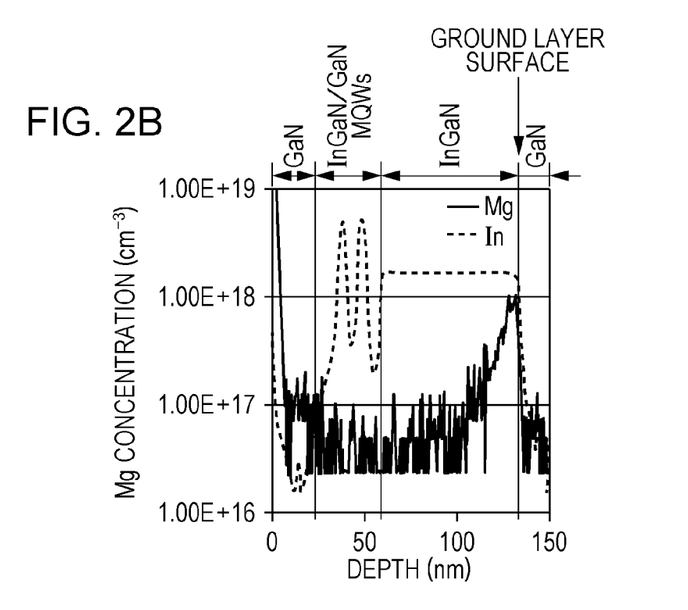

The Mg adsorption layer 103 will now be described. As described above, the Mg adsorption layer 103 allows Mg that desorbed from a reactor member when the substrate is heated to be incorporated thereinto and thereby suppresses mixing of Mg in the active layer 104. The Mg adsorption layer 103 is a nitride semiconductor containing In, and specific examples thereof include an InGaN semiconductor, an AlInN semiconductor, an AlInGaN semiconductor, and an InN semiconductor. FIGS. 2A and 2B show the results of tests of the Mg adsorption layer 103. FIGS. 2A and 2B each show the result of secondary ion mass spectrometry (SIMS) depth profiling to determine the influence of the Mg memory effect.

Samples used in the tests were prepared as follows. A template substrate 100 on which a GaN layer was formed as the ground layer 102 was prepared. Subsequently, the template substrate 100 was placed in an MOCVD system in which a Mg-containing raw material had been used, and an active layer 104 was grown on the substrate.

FIG. 2A shows a result of SIMS using a sample prepared by growing three-period InGaN/GaN multiple quantum wells (MQWs) as an active layer 104 directly on the template substrate 100. FIG. 2B shows a result of SIMS using another sample prepared by growing a 70-nm $In_{0.01}Ga_{0.99}N$ layer serving as the Mg adsorption layer 103 on the template substrate 100 and further growing two-period InGaN/GaN MQWs serving as the active layer 104 on the $In_{0.01}Ga_{0.99}N$ layer.

The result of the sample shown in FIG. 2A, in which the active layer 104 was grown directly on the substrate, shows that Mg was detected in the active layer 104. In particular, a high concentration of Mg was detected in the InGaN quantum well layer which is shown in FIG. 2A with arrows, in which In is detected. Therefore, Mg is considered to be likely to be incorporated particularly into the InGaN quantum well layer.

The result of the sample including an $In_{0.01}Ga_{0.99}N$ layer shown in FIG. 2B shows that the Mg concentration in the $In_{0.01}Ga_{0.99}N$ layer decreases from the template substrate 100 side to the active layer 104 side and reaches below the detection limit at the point at which the thickness of the $In_{0.01}Ga_{0.99}N$ layer becomes about 30 nm.

Table 1 shows the effect of the Mg adsorption layer 103 by comparison of the optical output powers of several light-emitting diodes (LEDs).

TABLE 1

| | Mg adsorption layer | | | |
|---|---|---|---|---|
| | No (conventional manufacturing method) | No | $In_{0.01}Ga_{0.99}N$ 70 nm | GaN 70 nm | GaN 150 nm |
| Light-output power ratio | 1 | 0.10 | 1.1 | 0.10 | 0.18 |

The sample LED having no Mg adsorption layer ("No (conventional manufacturing method)" in Table 1) was an LED prepared by growing a 5-μm-thick ground layer and an LED structure on the substrate at a time in a manufacturing system in which a Mg-containing raw material had been used. This sample LED, since having a thick ground layer, allowed desorption of Mg during the growth of the ground layer, thereby suppressing mixing of Mg in the active layer. This sample LED was considered as a reference.

Other sample LEDs were each prepared as follows. A template substrate 100 including a 5-μm n-type GaN layer serving as the ground layer 102 was prepared. The template substrate was placed in a manufacturing system in which a Mg-containing raw material had been used, and a certain LED structure was grown on the template substrate. Specifically, an LED without the Mg adsorption layer 103, an LED including an InGaN layer serving as the Mg adsorption layer 103, and an LED including a GaN layer serving as the Mg adsorption layer 103 were prepared. The other sample LED having no Mg adsorption layer ("No" in Table 1) was an LED prepared by growing the active layer directly on the template substrate 100 and had a low optical output power ratio of 0.10 relative to that of the sample LED prepared by the conventional manufacturing method. In this sample LED, Mg adhering to a reactor member desorbed when the substrate was heated and was mixed in the active layer, which caused luminous efficiency to be reduced.

The sample LED including a 70-nm $In_{0.01}Ga_{0.99}N$ layer serving as the Mg adsorption layer 103 had an optical output power ratio of 1.1, that is, an optical output power substantially equal to that of the sample LED prepared by the conventional manufacturing method. This is because Mg was adsorbed to the $In_{0.01}Ga_{0.99}N$ layer, and as a result mixing of Mg in the active layer 104 was suppressed. The sample LED including a 70-nm GaN layer serving as the Mg adsorption layer 103 had an optical output power ratio of 0.10. The sample LED including a 150-nm GaN layer serving as the Mg adsorption layer 103 had an optical output power ratio of 0.18. This shows that the desired effect is not achieved when the Mg adsorption layer 103 is a GaN layer and even when the thickness of the GaN layer is increased nearly twice. In other words, the Mg adsorption layer 103 containing no In does not show the effect of suppressing Mg memory effect.

The above-described results of the comparison of optical output power of LEDs and the results of SIMS analysis show that the Mg adsorption layer 103 containing In allows Mg to be incorporated into the Mg adsorption layer 103 and thereby suppresses mixing of Mg in the active layer 104. The thickness of the Mg adsorption layer 103 is preferably 30 nm or more because the Mg concentration in the Mg adsorption layer 103 decreases when the Mg adsorption layer 103 starts growing and until the thickness of the Mg adsorption layer 103 reaches about 30 nm. The thickness of the Mg adsorption layer 103 is more preferably 50 nm or more and further preferably 70 nm or more in order to prevent Mg from diffusing from the Mg adsorption layer 103 to the active layer 104. The thickness of the Mg adsorption layer 103 is preferably 1,000 nm or less, more preferably 500 nm or less, and further preferably 300 nm or less.

A buffer layer may be formed on the template substrate 100. For example, when some polishing flaws or the like are present on the surface of the ground layer 102, a quantum well structure of steep hetero-interface between a well layer and a barrier layer or the like cannot be grown on the ground layer 102. Thus, the buffer layer is formed on the template substrate 100 in order to improve crystal quality. The Mg adsorption layer 103 may serve also as the buffer layer. Alternatively, the Mg adsorption layer 103 and the buffer layer may be formed as a multi-layered structure. However, an increase in the thickness of the Mg adsorption layer 103 or the buffer layer results in a prolonged manufacturing time and an increase in the amount of raw material used, which increases the cost. Therefore, the distance between the template substrate 100 and the active layer 104 is preferably 1,000 nm or less, more preferably 500 nm or less, further preferably 300 nm or less.

Note that the distance between template substrate 100 and the active layer 104 is set in order to define the total thickness of the one or more semiconductor layers including the Mg adsorption layer 103, which is formed on the template substrate 100 after the template substrate 100 is placed in a reactor and before the active layer is formed in the reactor. For example, when the Mg adsorption layer 103 is formed directly on the template substrate 100, the above-described distance refers to the distance from the interface between the Mg adsorption layer 103 and the template substrate 100 (i.e., the interface between the Mg adsorption layer 103 and the substrate 101) to the interface between the active layer 104 and the template substrate 100 (i.e., the interface between the active layer 104 and the substrate 101). When another semiconductor layer is formed on the template substrate 100 prior to formation of the Mg adsorption layer 103, the above-described distance refers to the distance from the interface between the semiconductor layer and the template substrate 100 (i.e., the interface between the semiconductor layer and the substrate 101) to the interface between the active layer 104 and the template substrate 100 (i.e., the interface between the active layer 104 and the substrate 101).

An excessively high molar fraction of InN in the Mg adsorption layer 103 results in a reduction in the band gap of the Mg adsorption layer 103, and the Mg adsorption layer 103 may disadvantageously absorb light emitted by the active layer 104. Therefore, the InN molar fraction is controlled so that the Mg adsorption layer 103 has a larger band gap than the active layer 104. Specifically, when the Mg adsorption layer 103 comprises $In_xGa_{1-x}N$ and the active layer 104 comprises $In_yGa_{1-y}N$, 0<x<y.

In order to prevent the Mg memory effect, a heat treatment that requires lower cost than cleaning or the like may be performed before the template substrate 100 is placed in the reactor and during one cycle of manufacturing each light-emitting device. In addition to Mg, other compounds contained in other raw materials used in the manufacturing of a semiconductor also adhere to a reactor member. Thus, when these other compounds are desorbed by the heat treatment, a quality active layer 104 may be formed, which further enhances the effect of the present invention.

According to Embodiment 1 described above, mixing of Mg in the active layer 104 due to the Mg memory effect and a reduction in luminous efficiency may be suppressed by a low-cost method of forming an ultrathin nitride semiconductor containing In having a thickness of about 30 nm.

Embodiment 2

In Embodiment 2, a method for producing a vertical cavity surface emitting laser (VCSEL) by utilizing the method for producing a nitride semiconductor light-emitting device according to the present invention is described. Specifically, a method for producing a VCSEL including a lower distributed Bragg reflector (DBR), an active layer, an upper DBR, and a current confinement layer interposed between the lower DBR and the active layer is described. This method for producing a VCSEL according to Embodiment 2 is described with reference to FIGS. 3A to 3D. A plurality of VCSELs can be manufactured by repeating the steps shown in FIGS. 3A to 3D a plurality of times.

Figure 3A:
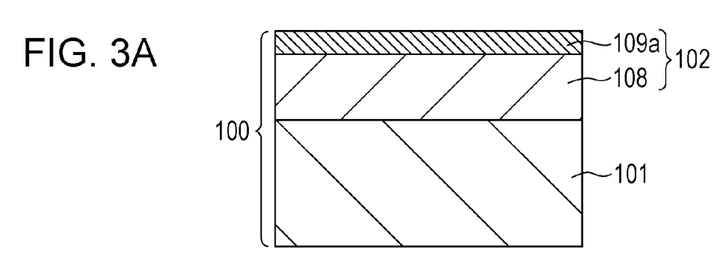
FIGS. 3A to 3D are diagrams for explaining the process for producing a VCSEL according to Embodiment 2 of the present invention.

First, a template substrate 100 was prepared as in Embodiment 1. As shown in FIG. 3A, a ground layer 102 constituted by an n-type lower DBR 108 and a functional layer 109a was formed on a substrate 101 by MOCVD, HVPE, MBE, PCVD, or sputtering. The lower DBR 108 has a multi-layered structure in which high-refractive-index layers and low-refractive-index layers are alternately stacked on top of one another. Examples of the high-refractive-index layer include a GaN layer and an InGaN layer. Examples of the low-refractive-index layer include an AlN layer and an AlGaN layer. The functional layer 109a serving as a current confinement layer is a high-resistivity layer such as an AlN layer or an AlGaN layer having a high AlN molar fraction.

Figure 3B:
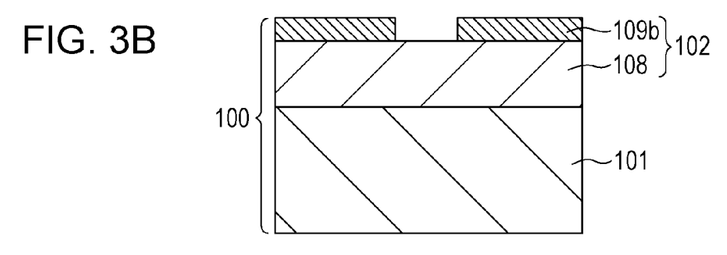

The substrate is removed from the manufacturing system, and a portion of the functional layer 109a is removed by photolithography and dry etching such as reactive ion etching (RIE) or inductively coupled plasma (ICP) to form a path through which current flows. Thus, a functional structure 109b having an electrical function (in this case, current confinement function) is formed by photolithography and dry-etching. Through the above-described steps, the template substrate 100 shown in FIG. 3B is prepared. In another case, the template substrate 100 may be prepared by, instead of forming the lower DBR layer, forming a semiconductor layer such as a GaN layer and burying a dielectric DBR in a portion of the semiconductor layer. Then, other portions of the VCSEL structure are grown on the template substrate 100. The manufacturing system is an MOCVD system or the like. A manufacturing system having a reactor in which a Mg-containing raw material has been used is directly used. The manufacturing system may be the same as that used in preparation of template substrate.

The template substrate 100 is placed in the manufacturing system, and a Mg adsorption layer 103 and an active layer 104 are formed on the template substrate 100 in one reactor of the manufacturing system. Mg that desorbed from a reactor member due to a temperature rise is incorporated into the Mg adsorption layer 103 and thereby mixing of Mg in the active layer 104 is suppressed. A buffer layer may optionally be interposed, as a spacer layer, between the ground layer 102 and the active layer 104 as in Embodiment 1. In another case, the Mg adsorption layer 103 may serve also as the spacer layer.

Figure 3C:
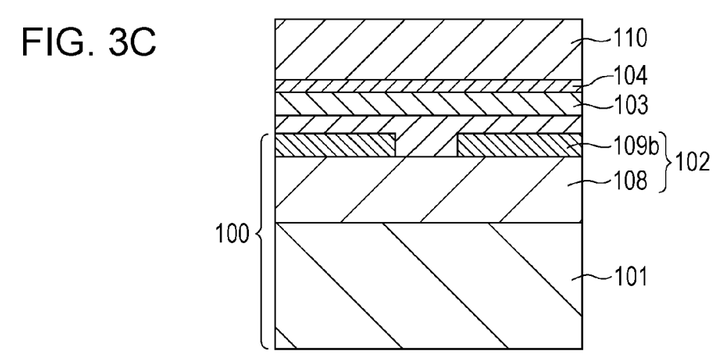

As shown in FIG. 3C, an upper DBR 110 that is a Mg-doped p-type semiconductor layer is formed on the active layer 104. In another case, a Mg-doped p-type semiconductor layer may be formed on the active layer 104 and a dielectric DBR may be formed on the p-type semiconductor layer.

Figure 3D:
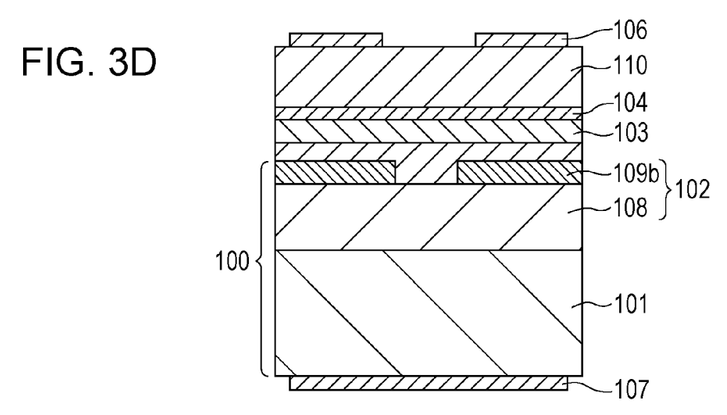

Then, the substrate having a structure including the Mg adsorption layer 103 and the active layer 104 is removed from the manufacturing system. As shown in FIG. 3D, a surface electrode 106 and a backside electrode 107 through which current is injected are formed on the surface and the backside surface of the substrate by vapor deposition. Through the above-described steps, the VCSEL is prepared.

Embodiment 3

In Embodiment 3, a method for producing a distributed feedback (DFB) laser including a one-dimensional diffraction grating and a two-dimensional photonic crystal surface emitting laser including a two-dimensional photonic crystal by utilizing the method for producing a nitride semiconductor light-emitting device according to the present invention is described. Specifically, a method for producing a laser including an n-type lower cladding layer, an active layer, an upper cladding layer, and a diffraction grating interposed between the lower cladding layer and the active layer is described. The method for producing such a DFB laser and such a photonic crystal surface emitting laser according to Embodiment 3 is described with reference to FIGS. 4A to 4D. A plurality of the DFB lasers or the photonic crystal surface emitting lasers can be manufactured by repeating the steps shown in FIGS. 4A to 4D.

Figure 4A:
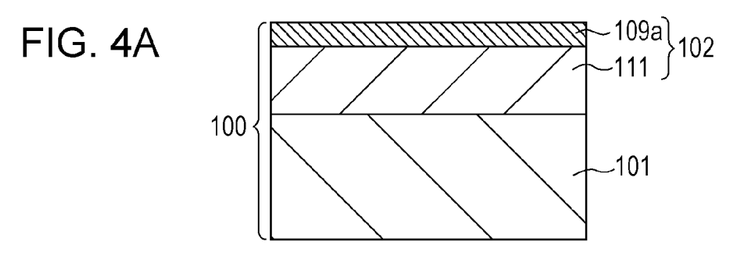
FIGS. 4A to 4D are diagrams for explaining the process for producing a DFB laser including a one-dimensional diffraction grating and a two-dimensional photonic crystal surface emitting laser including a two-dimensional diffraction grating according to Embodiment 3 of the present invention.
Figure 4B:
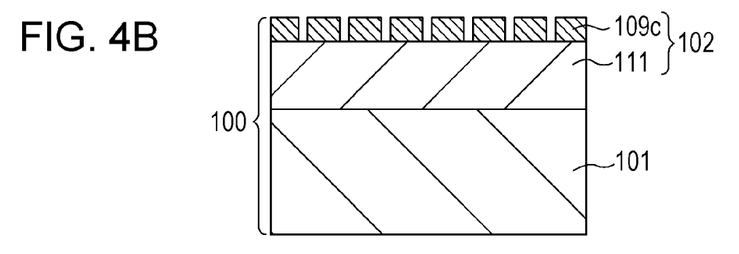

First, a template substrate 100 including a substrate 101 and a ground layer 102 formed on the substrate 101 is prepared as in Embodiment 1. As shown in FIG. 4A, the ground layer 102 including a lower cladding layer 111 and a functional layer 109a is formed by MOCVD, HVPE, MBE, PCVD, sputtering, or the like. The substrate is removed from the manufacturing system, and a functional structure 109c having an optical function is formed in the functional layer 109a by photolithography or electron beam lithography and by dry-etching such as RIE or ICP. The functional structure 109c is a one-dimensional or two-dimensional diffraction grating including a semiconductor layer and a medium having lower refractive index than the semiconductor layer. Examples of the low-refractive-index medium used in the diffraction grating include air or a dielectric material. Through the above-described steps, the template substrate 100 is prepared.

Next, other portions of a laser structure are grown on the template substrate 100. The manufacturing system is an MOCVD system or the like. A manufacturing system including a reactor in which a Mg-containing raw material has been used is directly used. The manufacturing system may be the same as that used in preparation of template substrate. The template substrate 100 is placed in the manufacturing system, and a Mg adsorption layer 103 and an active layer 104 are formed on the template substrate 100 in one reactor of the manufacturing system. Mg that desorbed from a reactor member due to a temperature rise is incorporated into the Mg adsorption layer 103 and thereby mixing of Mg in the active layer 104 is suppressed.

Figure 4C:
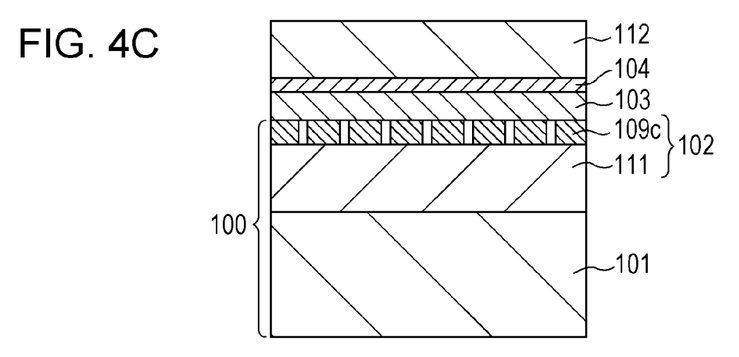

As shown in FIG. 4C, an upper cladding layer 112 that is a Mg-doped p-type semiconductor layer is formed on the active layer 104.

Figure 4D:
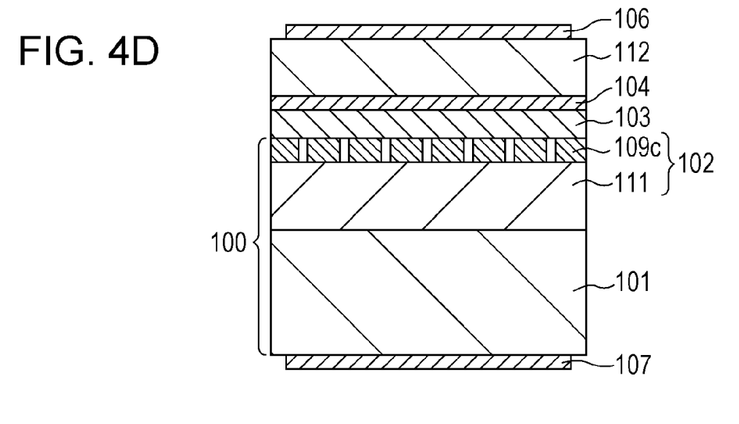

Then, the substrate having a structure including the Mg adsorption layer 103 and the active layer 104 is removed from the manufacturing system. As shown in FIG. 4D, a surface electrode 106 and a backside electrode 107 through which current is injected are formed on the surface and the backside surface of the substrate by vapor deposition. Through the above-described steps, the one-dimensional DFB laser or a two-dimensional photonic crystal surface emitting laser is prepared.

EXAMPLES

Hereafter, Examples of the present invention will now be described.

Example 1

Figure 5:
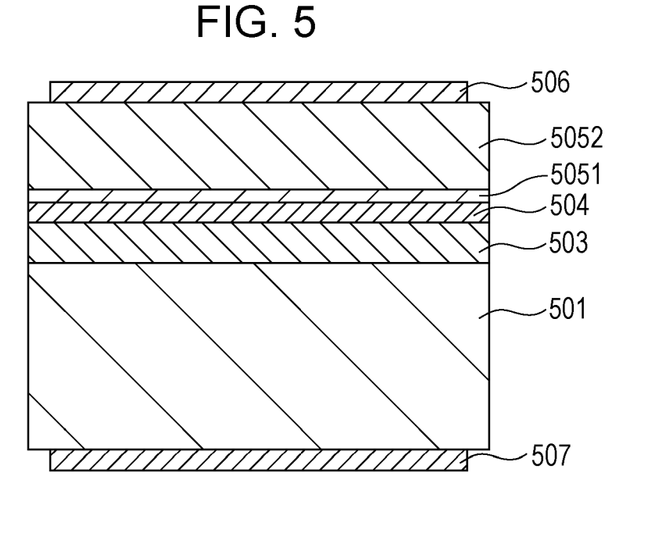
FIG. 5 is a cross-sectional view for explaining the structure of a light-emitting diode prepared in Example 1 of the present invention.

In Example 1, an example of a nitride semiconductor light-emitting device produced by the method for producing a nitride semiconductor light-emitting device according to Embodiment 1 of the present invention is described. Specifically, in Example 1, a blue-violet light-emitting diode was prepared as an example. FIG. 5 is a schematic cross-sectional view of the blue-violet light-emitting diode prepared in Example 1. The substrate 101 was an n-type GaN substrate 501. The n-type GaN substrate 501 was used alone as the template substrate 100 because, as is described in Embodiment 1, the n-type GaN substrate 501 has conductivity and thus allows a nitride semiconductor to grow directly thereon.

The n-type GaN substrate 501 was placed in an MOCVD system in which a Mg-containing raw material had been used. The substrate was heated, and a 50-nm $In_{0.01}Ga_{0.99}N$ layer 503 serving as the Mg adsorption layer 103 was grown on the substrate. Subsequently, a multiple-quantum-well structure 504 constituted by a 2.5-nm $In_{0.10}Ga_{0.90}N$ quantum well layer and a 7.5-nm GaN layer, which served as the active layer 104, was grown on the $In_{0.01}Ga_{0.99}N$ layer 503. A two-layer structure constituted by a 20-nm p-type $Al_{0.15}Ga_{0.85}N$ layer 5051 serving as an electron-blocking layer and a 100-nm p-type GaN layer 5052 on which an electrode was to be formed, which served as the semiconductor layer 105, was grown on the multiple-quantum-well structure 504. Then, the substrate was removed from the MOCVD system. A p-electrode 506 comprising Ni/Au was formed as the surface electrode 106 on the surface of the substrate and an n-electrode 507 comprising Ti/Al/Ti/Au was formed as the backside electrode 107 on the backside of the substrate by vapor deposition. Through the above-described process, the blue-violet light-emitting diode was prepared. A plurality of the light-emitting diodes can be manufactured by repeating the above-described process.

Example 2

Figure 6:
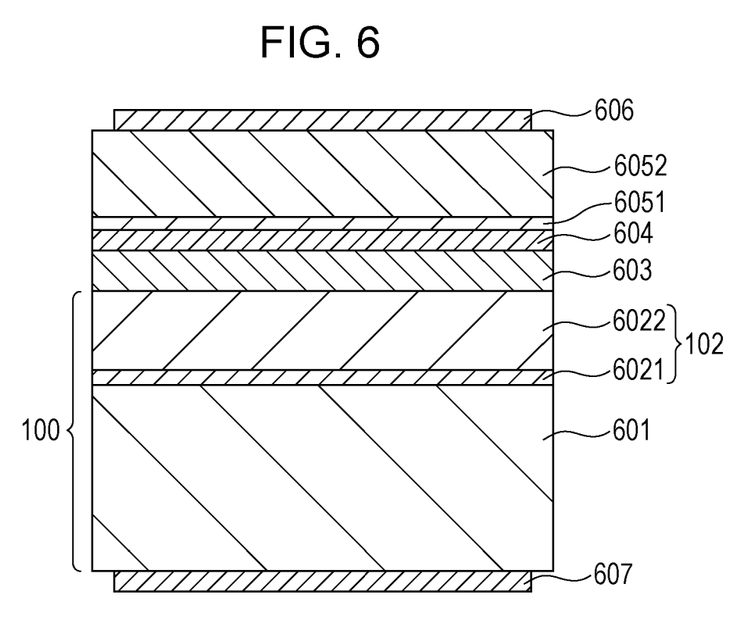
FIG. 6 is a cross-sectional view for explaining the structure of a light-emitting diode prepared in Example 2 of the present invention.

In Example 2, another example of a nitride semiconductor light-emitting device produced by the method for producing a nitride semiconductor light-emitting device according to Embodiment 1 of the present invention, which is different from the one prepared in Example 1, is described. Specifically, in Example 2, a blue-violet light-emitting diode on a Si substrate was prepared as an example. FIG. 6 is a schematic cross-sectional view of the blue-violet light-emitting diode prepared in Example 2. First, a template substrate 100 was prepared. The substrate 101 was an n-type Si substrate 601. A two-layer structure constituted by a 20-nm n-type $Al_{0.50}Ga_{0.50}N$ layer 6021 and a 2-μm n-type GaN layer 6022 was formed as the ground layer 102 on the n-type Si substrate 601 by sputtering. Thus, the template substrate 100 was prepared.

Next, the template substrate 100 was placed in an MOCVD system in which a Mg-containing raw material had been used. The substrate was heated, and a 30-nm $In_{0.01}Ga_{0.99}N$ layer 603 serving as the Mg adsorption layer 103 was grown on the substrate. Subsequently, a multiple-quantum-well structure 604 constituted by a 2.5-nm $In_{0.10}Ga_{0.90}N$ quantum well layer and a 7.5-nm GaN layer, which served as the active layer 104, was grown on the $In_{0.01}Ga_{0.99}N$ layer 603. A two-layer structure constituted by a 20-nm p-type $Al_{0.15}Ga_{0.85}N$ layer 6051 serving as an electron-blocking layer and a 100-nm p-type GaN layer 6052 on which an electrode was to be formed, which served as the semiconductor layer 105, was grown on the multiple-quantum-well structure 604. Then, the substrate was removed from the MOCVD system. A p-electrode 606 comprising Ni/Au was formed as the surface electrode 106 on the surface of the substrate and an n-electrode 607 comprising Ti/Al/Ti/Au was formed as the backside electrode 107 on the backside of the substrate by vapor deposition. Through the above-described process, the blue-violet light-emitting diode on a Si substrate was prepared. A plurality of the light-emitting diodes can be manufactured by repeating the above-described process.

Example 3

Figure 7:
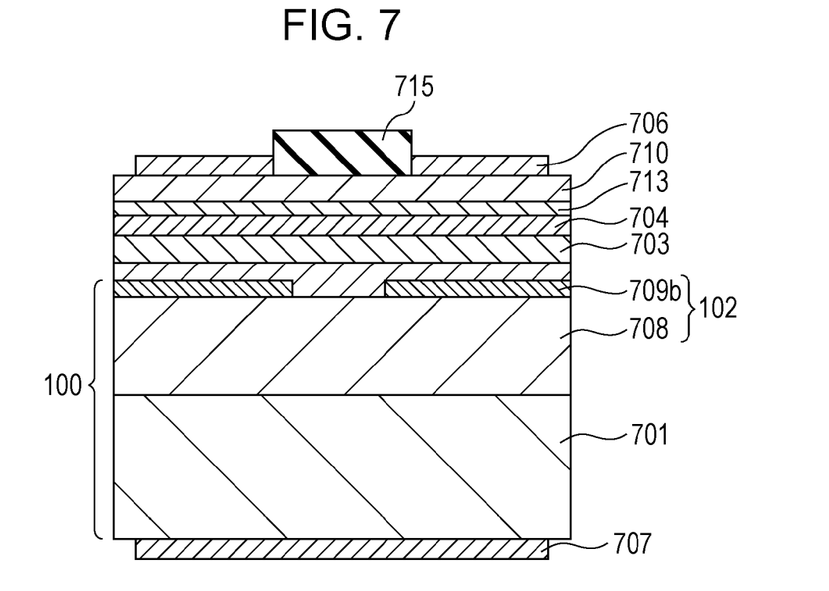
FIG. 7 is a cross-sectional view for explaining the structure of a VCSEL prepared in Example 3 of the present invention.

In Example 3, a method for producing a VCSEL by utilizing the method for producing a nitride semiconductor light-emitting device according to Embodiment 2 of the present invention will be described. FIG. 7 is a schematic cross-sectional view of a VCSEL prepared in Example 3. First, a template substrate 100 was prepared. A substrate 101 was an n-type GaN substrate 701. A 30-pair n-type GaN/n-type $Al_{0.50}Ga_{0.50}N$ DBR708 serving as the lower DBR 108 and a 10-nm AlN layer serving as the functional layer 109a for current confinement, which served as the ground layer 102, were grown on the n-type GaN substrate 701 in an MOCVD system. Then, the substrate was removed from the MOCVD system. An 8-μm-diameter circular pattern was formed by photolithography, and a portion of the AlN layer was removed by dry-etching using the circular pattern to form, as the functional structure 109b, a current confinement structure 709b that was an AlN insulation layer. Through the above-described steps, the template substrate 100 was prepared.

The template substrate 100 was then placed in an MOCVD system in which a Mg-containing raw material had been used. A 50-nm n-type GaN layer serving as a spacer layer was grown on the current confinement structure 709b, and the surface of the n-type GaN layer was planarized. Subsequently, a 70-nm $In_{0.01}Ga_{0.99}N$ layer 703 serving as the Mg adsorption layer 103 was grown on the n-type GaN layer. A three-period MQWs 704 constituted by a 2.5-nm $In_{0.10}Ga_{0.90}N$ quantum well layer and a 7.5-nm GaN barrier layer, which served as the active layer 104, was grown on the $In_{0.01}Ga_{0.99}N$ layer 703. Other layers, that is, a 20-nm $Al_{0.15}Ga_{0.85}N$ layer 713 serving as an electron-blocking layer and a 5-pair p-type GaN/p-type $Al_{0.10}Ga_{0.90}N$ DBR 710 serving as the upper DBR 110 were grown on the three-period MQWs 704. Then, the substrate was removed from the MOCVD system. A p-electrode 706 comprising Ni/Au having a window was formed as the surface electrode 106 on the surface of the substrate, and an n-electrode 707 comprising Ti/Al/Ti/Au was formed as the backside electrode 107 on the backside of the substrate. A 7-pair $SiO_2/Ta_2O_5$ dielectric DBR 715 was formed on the window of the p-electrode 706. Thus, the VCSEL was prepared. A plurality of the VCSELs can be manufactured by repeating the above-described process.

Example 4

Figure 8:
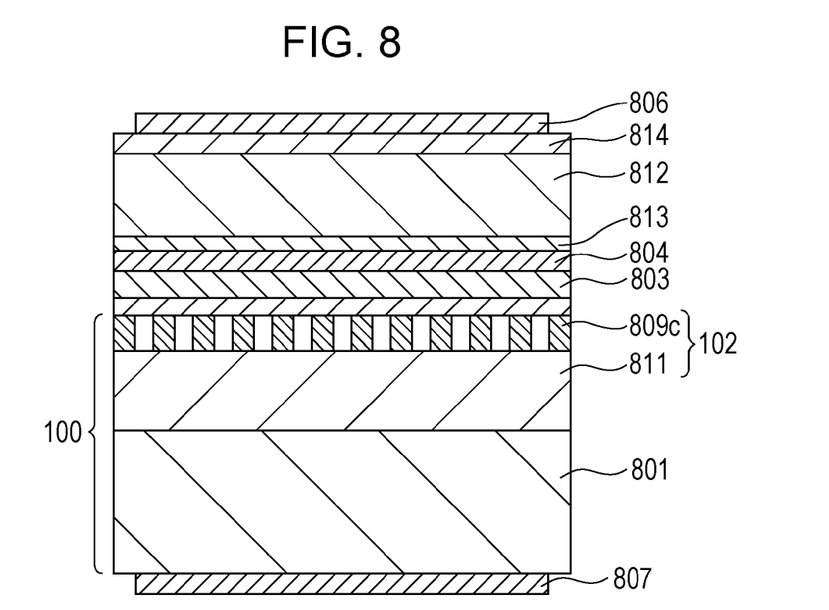
FIG. 8 is a cross-sectional view for explaining the structure of a DFB laser prepared in Example 4 of the present invention.

In Example 4, a method for producing a DFB laser including a one-dimensional diffraction grating according to the Embodiment 3 of the present invention is described. FIG. 8 is a cross-sectional view of a DFB laser prepared in Example 4. First, a template substrate 100 was prepared. The substrate 101 was an n-type GaN substrate 801. A 700-nm n-type $Al_{0.07}Ga_{0.93}N$ layer 811 serving as the lower cladding layer 111 and a 50-nm GaN layer serving as the functional layer 109a, which served as the ground layer 102, were grown on the n-type GaN substrate 801 in an MOCVD system. Then, the substrate was removed from the MOCVD system, and a periodic structure constituted by GaN portions and air spaces having a width of 80 nm per period was formed by electron beam (EB) lithography and dry-etching. Thus, a one-dimensional diffraction grating 809c was formed as a functional structure 109c having an optical function. Through the above-described steps, the template substrate 100 was prepared.

The template substrate 100 was placed in an MOCVD system in which a Mg-containing raw material had been used. A GaN layer was grown on the diffraction grating 809c so as to close the upper portions of the air spaces, and a 70-nm $In_{0.01}Ga_{0.99}N$ layer 803 serving as the Mg adsorption layer 103 was grown on the GaN layer. Subsequently, a three-period multiple-quantum-well structure 804 constituted by a 2.5-nm $In_{0.10}Ga_{0.90}N$ quantum well layer and a 7.5-nm barrier layer, which served as the active layer 104, was grown on the $In_{0.01}Ga_{0.99}N$ layer 803. Other layers, that is, a 20-nm $Al_{0.15}Ga_{0.85}N$ layer 813 serving as an electron-blocking layer, a 500-nm p-type $Al_{0.07}Ga_{0.93}N$ layer 812 serving as the upper cladding layer 112, and a p-type GaN layer 814 on which an electrode was to be formed were grown on the multiple-quantum-well structure 804. Then, the substrate was removed from the MOCVD system. A p-electrode 806 comprising Ni/Au having a window was formed as the surface electrode 106 on the surface of the substrate. An n-electrode 807 comprising Ti/Al/Ti/Au was formed as the backside electrode 107 on the backside of the substrate. Thus, the DFB laser was prepared. A plurality of the DFB lasers can be manufactured by repeating the above-described process.

Example 5

Figure 9:
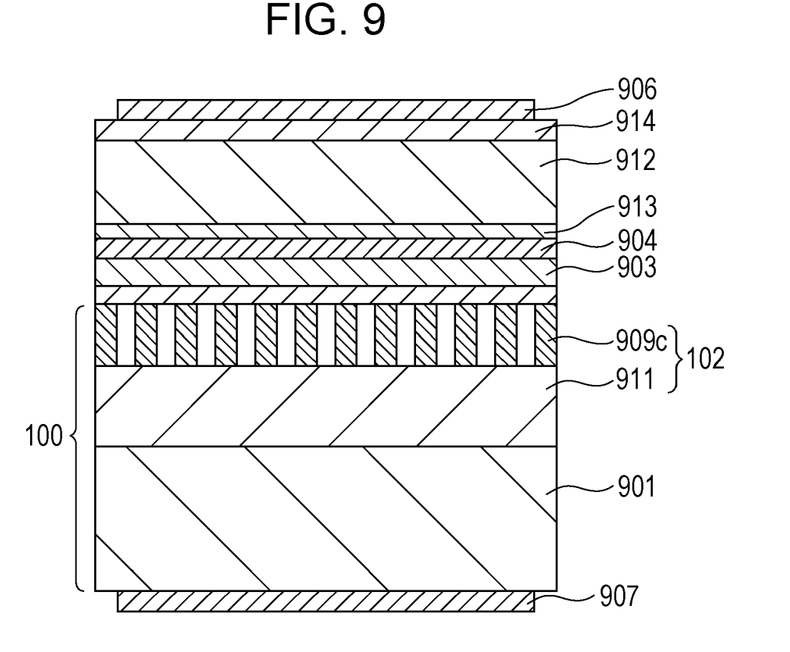
FIG. 9 is a cross-sectional view for explaining the structure of a two-dimensional photonic crystal surface emitting laser prepared in Example 5 of the present invention.

In Example 5, a method for producing a two-dimensional photonic crystal surface emitting laser including a two-dimensional diffraction grating according to the Embodiment 3 of the present invention is described. FIG. 9 is a cross-sectional view of a two-dimensional photonic crystal surface emitting laser prepared in Example 5. First, a template substrate 100 was prepared. The substrate 101 was an n-type GaN substrate 901. A 800-nm n-type $Al_{0.07}Ga_{0.93}N$ layer 911 serving as the lower cladding layer 111 and a 160-nm GaN layer serving as the functional layer 109a, which served as the ground layer 102, were grown on the n-type GaN substrate 901 in an MOCVD system. Then, the substrate was removed from the MOCVD system, and a two-dimensional periodic structure (two-dimensional photonic crystal layer) constituted by a GaN layer and holes was formed by EB lithography and dry-etching. Thus, a two-dimensional diffraction grating 909c was formed as a functional structure 109c having an optical function. The diffraction grating 909c had holes arranged in the form of a square grid. The size of the unit grid was 160 nm and the diameter of each hole was 60 nm. Through the above-described steps, the template substrate 100 was prepared.

The template substrate 100 was placed in an MOCVD system in which a Mg-containing raw material had been used. A GaN layer was grown on the diffraction grating 909c so as to close the upper portions of the holes, and a 70-nm $In_{0.01}Ga_{0.99}N$ layer 903 serving as the Mg adsorption layer 103 was grown on the GaN layer. Subsequently, a three-period multiple-quantum-well structure 904 constituted by a 2.5-nm $In_{0.10}Ga_{0.90}N$ quantum well layer and a 7.5-nm barrier layer, which served as the active layer 104, was grown on the $In_{0.01}Ga_{0.99}N$ layer 903. Other layers, that is, a 20-nm $Al_{0.15}Ga_{0.85}N$ layer 913 serving as an electron-blocking layer, a 500-nm p-type $Al_{0.07}Ga_{0.93}N$ layer 912 serving as the upper cladding layer 112, and a p-type GaN layer 914 on which an electrode was to be formed were grown on the multiple-quantum-well structure 904. Then, the substrate was removed from the MOCVD system. A p-electrode 906 comprising Ni/Au was formed as the surface electrode 106 on the surface of the substrate. An n-electrode 907 comprising Ti/Al/Ti/Au was formed as the backside electrode 107 on the backside of the substrate. Thus, the two-dimensional photonic crystal surface emitting laser was prepared. A plurality of the two-dimensional photonic crystal surface emitting lasers can be manufactured by repeating the above-described process.

According to the present invention, a method for producing a nitride semiconductor light-emitting device with which the memory effect may be suppressed at low cost and a nitride semiconductor light-emitting device are realized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-224590 filed Oct. 9, 2012, which is hereby incorporated by reference herein in its entirety.

What is claimed is:
1. A light-emitting device comprising:
 a layer containing In and Mg;
 an active layer comprising a nitride semiconductor; and
 a p-type layer,
 wherein the layer containing In and Mg, the active layer and the p-type layer are arranged in order from a side of a substrate.
2. The light-emitting device according to claim 1,
 wherein a Mg concentration in the layer containing In and Mg decreases from the side of the substrate side to a side of the active-layer side.
3. The light-emitting device according to claim 1,
 wherein the layer containing In and Mg has a thickness of 30 nm or more.
4. The light-emitting device according to claim 1,
 wherein a distance between the substrate and the active layer is 1,000 nm or less.
5. The light-emitting device according to claim 1,
 wherein the layer containing In and Mg comprises $In_xGa_{1-x}N$ and the active layer comprises $In_yGa_{1-y}N$, where $0<x<y$.

6. The light-emitting device according to claim 1, further comprising a first reflector and a second reflector,
  wherein the active layer and the layer containing In and Mg are arranged between the first reflector and the second reflector.

7. The light-emitting device according to claim 6,
  wherein at least one of the first reflector and the second reflector comprises a distributed Bragg reflector.

8. The light-emitting device according to claim 1, further comprising a diffraction grating.

9. The light-emitting device according to claim 1, further comprising a photonic crystal.

10. The light-emitting device according to claim 1,
  wherein the layer containing In and Mg comprises a nitride semiconductor.

11. The light-emitting device according to claim 1,
  wherein a distance between the substrate and the active layer is 500 nm or less.

12. The light-emitting device according to claim 1,
  wherein a distance between the substrate and the active layer is 300 nm or less.

\* \* \* \* \*